US012575345B2

(12) United States Patent
Hao

(10) Patent No.: US 12,575,345 B2
(45) Date of Patent: Mar. 10, 2026

(54) METHOD FOR IMPROVING CONTINUITY OF WORK FUNCTION THIN FILM

(71) Applicant: Shanghai Huali Integrated Circuit Corporation, Shanghai (CN)

(72) Inventor: Yanxia Hao, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 526 days.

(21) Appl. No.: 18/321,337

(22) Filed: May 22, 2023

(65) Prior Publication Data

US 2023/0290634 A1     Sep. 14, 2023

(30) Foreign Application Priority Data

Nov. 22, 2022   (CN) .......................... 202211466814.5

(51) Int. Cl.
H01L 21/02            (2006.01)
(52) U.S. Cl.
CPC .. H01L 21/02255 (2013.01); H01L 21/02164 (2013.01); H01L 21/02238 (2013.01)

(58) Field of Classification Search
None
See application file for complete search history.

(56) References Cited

U.S. PATENT DOCUMENTS

2013/0224943 A1*   8/2013   Hsieh ................ H01L 21/02164
                                                                438/591

* cited by examiner

*Primary Examiner* — Kyoung Lee
(74) *Attorney, Agent, or Firm* — Quarles & Brady LLP

(57) ABSTRACT

The present application provides a method for improving continuity of a work function thin film, forming a tunneling oxide layer on a substrate; forming an isolation layer on the tunneling oxide layer; forming a work function thin film on the isolation layer, the work function thin film serves as a floating gate in a semi-floating gate device to store charges and conduction electrons, performing a heat treatment on the tunneling oxide layer, the isolation layer and the work function layer, the isolation layer reacts with a surface of the tunneling oxide layer to form a dense barrier layer, the isolation layer reacts with O in the tunneling oxide layer to form a new tunneling oxide layer, the heat treatment lasts until the isolation layer is fully consumed, and the work function thin film remaining after the reaction uniformly covers an upper surface of the dense barrier layer.

11 Claims, 2 Drawing Sheets

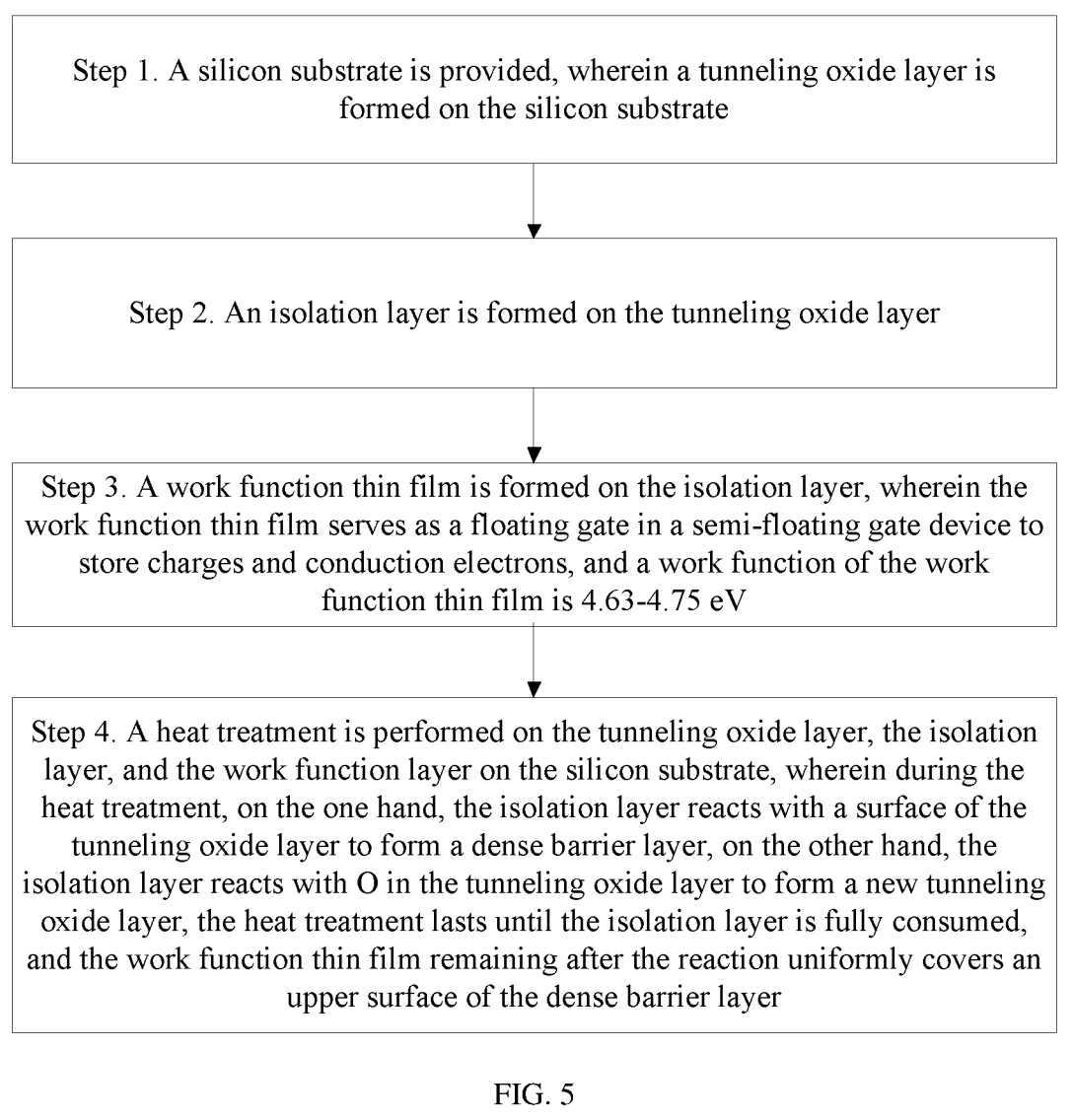

Step 1. A silicon substrate is provided, wherein a tunneling oxide layer is formed on the silicon substrate Step 2. An isolation layer is formed on the tunneling oxide layer Step 3. A work function thin film is formed on the isolation layer, wherein the work function thin film serves as a floating gate in a semi-floating gate device to store charges and conduction electrons, and a work function of the work function thin film is 4.63-4.75 eV Step 4. A heat treatment is performed on the tunneling oxide layer, the isolation layer, and the work function layer on the silicon substrate, wherein during the heat treatment, on the one hand, the isolation layer reacts with a surface of the tunneling oxide layer to form a dense barrier layer, on the other hand, the isolation layer reacts with O in the tunneling oxide layer to form a new tunneling oxide layer, the heat treatment lasts until the isolation layer is fully consumed, and the work function thin film remaining after the reaction uniformly covers an upper surface of the dense barrier layer

FIG. 5

METHOD FOR IMPROVING CONTINUITY OF WORK FUNCTION THIN FILM

CROSS-REFERENCES TO RELATED APPLICATIONS

This application claims priority to Chinese patent application No. 202211466814.5, filed on Nov. 22, 2022, at CNIPA, and entitled "METHOD FOR IMPROVING CONTINUITY OF WORK FUNCTION THIN FILM", the disclosure of which is incorporated herein by reference in entirety.

TECHNICAL FIELD

The present application relates to the technical field of semiconductors, in particular to a method for improving continuity of a work function thin film.

BACKGROUND

The titanium nitride (TiN) material is often used as a metal gate for storing charges and conduction electrons due to the good thermal stability and appropriate work function (4.63-4.75 eV) thereof. In an existing semi-floating gate device, furnace TIN serves as a floating gate, and SiO2 serves as a tunnel oxide layer, forming a stack structure of silicon oxide and TIN. A TEM result indicates that TIN is continuous after TIN deposition, but the TIN continuity deteriorates after a heat treatment and TIN wet etching. In order to verify the TIN discontinuity mechanism, a TIN discontinuity experiment is conducted online, and an experimental result indicates that silicon oxide and TIN are continuous before the heat treatment and the TIN becomes discontinuous and thickened after the heat treatment. The TIN is prone to oxidation, and at a high temperature, the O element in the tunnel oxide layer enters the TIN lattice to replace the N element, rendering the TIN film discontinuous and thickened. Such the discontinuous TIN leads to an electric leakage in the subsequent device.

BRIEF SUMMARY

In view of the above defect in the prior art, the object of the present application is to provide a method for improving continuity of a work function thin film, so as to solve the prior-art problem of deterioration of the continuity of the work function layer after a heat treatment which leads to an electric leakage in a device.

In order to achieve the above object and other related objects, the present application provides a method for improving continuity of a work function thin film, at least including:

step 1, providing a silicon substrate, wherein a tunneling oxide layer is formed on the silicon substrate;

step 2, forming an isolation layer on the tunneling oxide layer;

step 3, forming a work function thin film on the isolation layer, wherein the work function thin film serves as a floating gate in a semi-floating gate device to store charges and conduction electrons, and a work function of the work function thin film is 4.63-4.75 eV; and step 4, performing a heat treatment on the tunneling oxide layer, the isolation layer, and the work function layer on the silicon substrate, wherein during the heat treatment, on the one hand, the isolation layer reacts with a surface of the tunneling oxide layer to form a dense barrier layer, on the other hand, the isolation layer reacts with O in the tunneling oxide layer to form a new tunneling oxide layer, the heat treatment lasts until the isolation layer is fully consumed, and the work function thin film remaining after the reaction uniformly covers an upper surface of the dense barrier layer.

In an example, the tunneling oxide layer in step 1 is SiO2.

In an example, the isolation layer is formed on the tunneling oxide layer by means of growth in step 2.

In an example, the isolation layer in step 2 is amorphous silicon.

In an example, the work function thin film is formed by means of growth deposition in step 3.

In an example, the work function thin film in step 3 is TiN.

In an example, a temperature of the heat treatment in step 4 is 390° C.

In an example, the surface of the tunneling oxide layer in step 4 refers to a surface portion in direct contact with the isolation layer.

In an example, the dense barrier layer formed in step 4 is located between a lower surface of the work function thin film remaining after the reaction and an upper surface of the formed new tunneling oxide layer.

In an example, the dense barrier layer formed in step 4 is TiSiN.

In an example, the new tunneling oxide layer formed in step 4 is SiO2; and the new tunneling oxide layer is located between an upper surface of the tunneling oxide layer and a lower surface of the dense barrier layer As stated above, the method for improving continuity of a work function thin film of the preset application has the following beneficial effects: the method of the present application is a method of growing an isolation layer at an interface between a tunnel oxide layer and TIN to solve discontinuity of the TIN. On the one hand, amorphous silicon reacts with the TIN to form a TiSiN dense layer which prevents diffusion of oxygen atoms into the TIN. On the other hand, the amorphous silicon reacts with oxygen atoms in silicon oxide at a temperature of 390° C., and under a continuous heat treatment, the amorphous silicon is fully converted into silicon oxide, ensuring removal of the amorphous silicon in subsequent processes and thereby ensuring the continuity of TIN growth. Such the isolation layer can not only prevent diffusion of oxygen atoms into the TIN, but also can be removed in subsequent processes without affecting a final device structure and electrical performance.

BRIEF DESCRIPTION OF THE DRAWINGS

FIG. 5 is a flowchart of a method for improving continuity of a work function thin film of the present application.

DETAILED DESCRIPTION OF THE DISCLOSURE

The embodiments of the present application are described below using specific examples, and those skilled in the art could readily understand other advantages and effects of the present application from the contents disclosed in the description. The present application can also be implemented or applied using other different specific implementations, and various details in the description can also be modified or changed based on different viewpoints and applications without departing from the spirit of the present application.

Please refer to FIGS. 1-5. It should be noted that the drawings provided in the embodiments are only used to illustrate the basic concept of the present application in a schematic way, so the drawings only show the components related to the present application rather than being drawn according to the number, shape, and size of the components in actual implementations. The type, number, and proportion of various components can be changed randomly in the actual implementations, and the layout of the components may be more complicated.

The present application provides a method for improving continuity of a work function thin film. Referring to FIG. 5, FIG. 5 is a flowchart of the method for improving continuity of a work function thin film of the present application. The method at least includes the following steps:

Step 1. A silicon substrate is provided, wherein a tunneling oxide layer is formed on the silicon substrate.

Figure 1:
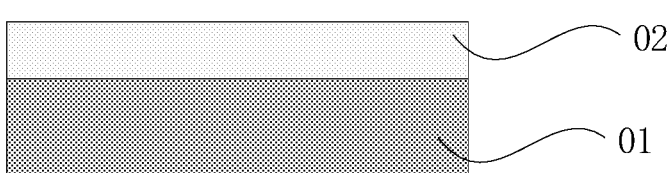
FIG. 1 is a schematic diagram of a structure where a tunneling oxide layer is provided on a substrate in the present application.

In an example of the present application, the tunneling oxide layer in step 1 of this embodiment is SiO2. Referring to FIG. 1, FIG. 1 is a schematic diagram of a structure where the tunneling oxide layer is provided on the silicon substrate in the present application. In step 1, the tunneling oxide layer 02 is formed on the silicon substrate 01. In an example, the tunneling oxide layer in this embodiment is SiO2.

Step 2. An isolation layer is formed on the tunneling oxide layer.

In an example of the present application, the isolation layer is formed on the tunneling oxide layer by means of growth in step 2 of this embodiment.

In an example of the present application, the isolation layer in step 2 of this embodiment is amorphous silicon.

Figure 2:
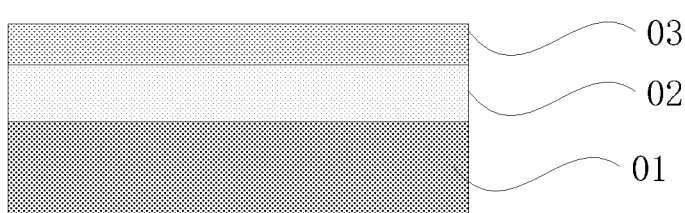
FIG. 2 is a schematic diagram of a structure where an isolation layer is formed on the tunneling oxide layer in the present application.

Referring to FIG. 2, FIG. 2 is a schematic diagram of a structure where the isolation layer is formed on the tunneling oxide layer in the present application. In step 2, the isolation layer 03 is formed on the tunneling oxide layer 02. The isolation layer 03 is formed on the tunneling oxide layer 02 by means of growth in step 2 of this embodiment. The isolation layer 03 is amorphous silicon (ASi).

Step 3. A work function thin film is formed on the isolation layer, wherein the work function thin film serves as a floating gate in a semi-floating gate device to store charges and conduction electrons, and a work function of the work function thin film is 4.63-4.75 eV.

In an example of the present application, the work function thin film is formed by means of growth deposition in step 3 of this embodiment.

In an example of the present application, the work function thin film in step 3 of this embodiment is TiN.

Figure 3:
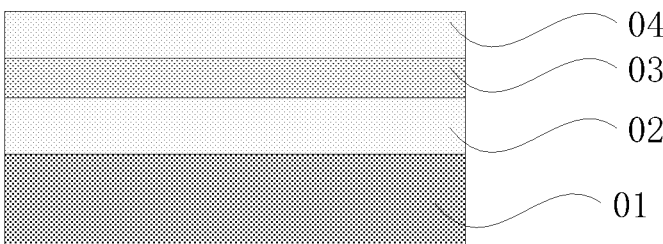
FIG. 3 is a schematic diagram of a structure where a work function thin film is formed on the isolation layer in the present application.

Referring to FIG. 3, FIG. 3 is a schematic diagram of a structure where the work function thin film is formed on the isolation layer in the present application. In step 3, the work function thin film 04 is formed on the isolation layer 03, wherein the work function thin film 04 serves as a floating gate in a semi-floating gate device to store charges and conduction electrons, and a work function of the work function thin film 04 is 4.63-4.75 eV. The work function thin film is formed by means of growth deposition in step 3 of this embodiment. The work function thin film 04 in this embodiment is TiN.

Step 4. A heat treatment is performed on the tunneling oxide layer, the isolation layer, and the work function layer on the silicon substrate, wherein during the heat treatment, on the one hand, the isolation layer reacts with a surface of the tunneling oxide layer to form a dense barrier layer, on the other hand, the isolation layer reacts with O in the tunneling oxide layer to form a new tunneling oxide layer, the heat treatment lasts until the isolation layer is fully consumed, and the work function thin film remaining after the reaction uniformly covers an upper surface of the dense barrier layer.

In an example of the present application, a temperature of the heat treatment in step 4 of this embodiment is 390° C.

In an example of the present application, the surface of the tunneling oxide layer in step 4 of this embodiment refers to a surface portion in direct contact with the isolation layer.

In an example of the present application, the dense barrier layer formed in step 4 of this embodiment is located between a lower surface of the work function thin film remaining after the reaction and an upper surface of the formed new tunneling oxide layer.

In an example of the present application, the dense barrier layer formed in step 4 of this embodiment is TiSiN.

In an example of the present application, the new tunneling oxide layer formed in step 4 of this embodiment is SiO2; and the new tunneling oxide layer is located between an upper surface of the tunneling oxide layer and a lower surface of the dense barrier layer.

Figure 4:
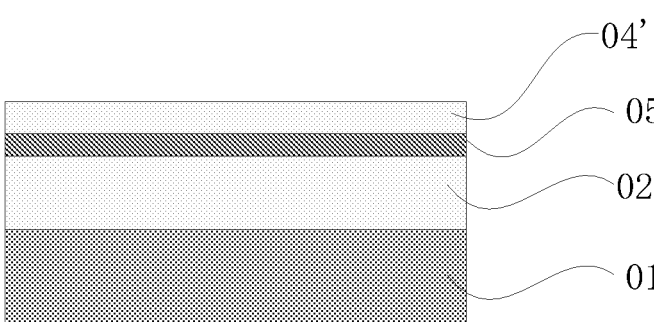
FIG. 4 is a schematic diagram of a structure obtained after a reaction between the isolation layer and the work function thin film in the present application.

Referring to FIG. 4, FIG. 4 is a schematic diagram of a structure obtained after the reaction between the isolation layer and the work function thin film in the present application. In step 4, the heat treatment is performed on the tunneling oxide layer 02, the isolation layer 03, and the work function layer 04 on the silicon substrate 01. During the heat treatment, on the one hand, the isolation layer 03 reacts with the surface of the tunneling oxide layer 02 to form the dense barrier layer 05, and on the other hand, the isolation layer 03 reacts with O (oxygen atoms) in the tunneling oxide layer 02 to form the new tunneling oxide layer. The heat treatment lasts until the isolation layer is fully consumed, and the work function thin film 04' remaining after the reaction uniformly covers the upper surface of the dense barrier layer 05. The temperature of the heat treatment in step 4 of this embodiment is 390° C. The surface of the tunneling oxide layer in step 4 refers to the surface portion in direct contact with the isolation layer 03. The formed dense barrier layer 05 is located between a lower surface of the work function thin film 04' remaining after the reaction and an upper surface of the formed new tunneling oxide layer. The new tunneling oxide layer is located on the upper surface of the original tunneling oxide layer 02, and in FIG. 4, the tunneling oxide layer and the new tunneling oxide layer are represented as a whole by 02'. The dense barrier layer in this embodiment is TiSiN. The formed new tunneling oxide layer is SiO2; and the new tunneling oxide layer is located between the upper surface of the (original) tunneling oxide layer and the lower surface of the dense barrier layer 05.

To sum up, the method of the present application is a method of growing an isolation layer at an interface between a tunnel oxide layer and TIN to solve discontinuity of the TIN. On the one hand, amorphous silicon reacts with the TIN to form a TiSiN dense layer which prevents diffusion of oxygen atoms into the TIN. On the other hand, the amorphous silicon reacts with oxygen atoms in silicon oxide at a temperature of 390° C., and under a continuous heat treatment, the amorphous silicon is fully converted into silicon oxide, ensuring removal of the amorphous silicon in subsequent processes and thereby ensuring the continuity of TIN growth. Such the isolation layer can not only prevent diffusion of oxygen atoms into the TIN, but also can be removed in subsequent processes without affecting a final device structure and electrical performance. Therefore, the present application effectively overcomes various defects in the prior art and has high industrial utilization value.

The above embodiment merely illustrates the principle and effect of the present application, rather than limiting the present application. Anyone skilled in the art can modify or change the above embodiment without departing from the spirit and scope of the present application. Therefore, all equivalent modifications or changes made by those with ordinary knowledge in the art without departing from the spirit and technical idea disclosed in the present application shall still be covered by the claims of the present application.

What is claimed is:

1. A method for improving continuity of a work function thin film, at least comprising:

step 1, providing a silicon substrate, wherein a tunneling oxide layer is formed on the silicon substrate;

step 2, forming an isolation layer on the tunneling oxide layer;

step 3, forming a work function thin film on the isolation layer, wherein the work function thin film serves as a floating gate in a semi-floating gate device to store charges and conduction electrons, and a work function of the work function thin film is 4.63-4.75 eV; and step 4, performing a heat treatment on the tunneling oxide layer, the isolation layer, and the work function layer on the silicon substrate, wherein during the heat treatment, on the one hand, the isolation layer reacts with a surface of the tunneling oxide layer to form a dense barrier layer, on the other hand, the isolation layer reacts with O in the tunneling oxide layer to form a new tunneling oxide layer, the heat treatment lasts until the isolation layer is fully consumed, and the work function thin film remaining after the reaction uniformly covers an upper surface of the dense barrier layer.

2. The method for improving continuity of a work function thin film according to claim 1, wherein the tunneling oxide layer in step 1 is SiO2.

3. The method for improving continuity of a work function thin film according to claim 1, wherein the isolation layer is formed on the tunneling oxide layer by means of growth in step 2.

4. The method for improving continuity of a work function thin film according to claim 2, wherein the isolation layer in step 2 is amorphous silicon.

5. The method for improving continuity of a work function thin film according to claim 1, wherein the work function thin film is formed by means of growth deposition in step 3.

6. The method for improving continuity of a work function thin film according to claim 4, wherein the work function thin film in step 3 is TiN.

7. The method for improving continuity of a work function thin film according to claim 1, wherein a temperature of the heat treatment in step 4 is 390° C.

8. The method for improving continuity of a work function thin film according to claim 6, wherein the surface of the tunneling oxide layer in step 4 refers to a surface portion in direct contact with the isolation layer.

9. The method for improving continuity of a work function thin film according to claim 1, wherein the dense barrier layer formed in step 4 is located between a lower surface of the work function thin film remaining after the reaction and an upper surface of the formed new tunneling oxide layer.

10. The method for improving continuity of a work function thin film according to claim 9, wherein the dense barrier layer formed in step 4 is TiSiN.

11. The method for improving continuity of a work function thin film according to claim 10, wherein the new tunneling oxide layer formed in step 4 is SiO2; and the new tunneling oxide layer is located between an upper surface of the tunneling oxide layer and a lower surface of the dense barrier layer.

* * * * *